(12) United States Patent
Taito et al.

(10) Patent No.: US 6,643,214 B2
(45) Date of Patent: Nov. 4, 2003

(54) SEMICONDUCTOR MEMORY DEVICE HAVING WRITE COLUMN SELECT GATE

(75) Inventors: Yasuhiko Taito, Hyogo (JP); Takeshi Fujino, Hyogo (JP); Masaru Haraguchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/166,122

(22) Filed: Jun. 11, 2002

(65) Prior Publication Data

US 2003/0123310 A1 Jul. 3, 2003

(30) Foreign Application Priority Data

Dec. 27, 2001 (JP) .......................... 2001-396338

(51) Int. Cl.<sup>7</sup> ................................. G11C 8/00
(52) U.S. Cl. ...................... 365/230.06; 365/230.03; 365/189.05
(58) Field of Search ................. 365/230.06, 230.03, 365/230.08, 189.05

(56) References Cited

U.S. PATENT DOCUMENTS

| | | | | |
|---|---|---|---|---|
| 5,946,263 A | * | 8/1999 | Takahashi | 365/230.06 |
| 6,172,918 B1 | * | 1/2001 | Hidaka | 365/189.11 |
| 6,330,202 B1 | | 12/2001 | Tanizaki et al. | |

OTHER PUBLICATIONS

Nakagome et al., "A 1.5V Circuit Technology for 64Mb DRAMs'", 1990 Symposium on VLSI Circuit, 1990, pp. 17–18.

* cited by examiner

Primary Examiner—Huan Hoang
(74) Attorney, Agent, or Firm—McDermott, Will & Emery

(57) ABSTRACT

This DRAM includes a driver circuit which is provided to be common to a plurality of columns and which lowers level of one of selected first and second bit lines to "L" level in accordance with potentials of first and second write data lines. Therefore, as compared with a conventional DRAM in which a driver circuit is provided for each column, the number of transistors is decreased and a layout area is reduced.

6 Claims, 13 Drawing Sheets

US 6,643,214 B2

1

SEMICONDUCTOR MEMORY DEVICE HAVING WRITE COLUMN SELECT GATE

BACKGROUND OF THE INVENTION

1. Field of the Invention

The present invention relates to a semiconductor memory device, and particularly to a semiconductor memory device capable of rewriting a data signal.

2. Description of the Background Art

FIG. 14 is a circuit block diagram which shows the main parts of a conventional dynamic random access memory (referred to as "DRAM" hereinafter). In FIG. 14, this DRAM includes a plurality of memory MC which are arranged in rows and columns, word lines WL which are provided to correspond to the rows, respectively, bit line pairs BL and /BL which are provided to correspond to the columns, respectively, a write data line pair WDL and /WDL. This DRAM also includes write column select lines WCSL, write column select gates 50, sense amplifiers 55 and equalizers 56.

Each write column select gate 50 includes N-channel MOS transistors 51 to 54. N-channel MOS transistors 51 and 52 are connected in series between bit line BL and write data line WDL and N-channel MOS transistors 53 and 54 are connected in series between bit line /BL and write data line /WDL. The gates of N-channel MOS transistors 51 and 53 are both connected to write column select line WCSL and those of N-channel MOS transistors 52 and 54 both receive a write driver enable signal WDE. Signal WDE is set at "L" level during write masking and set at "H" level during an ordinary operation. If write column select line WCSL in the column according to a column address signal CA is set at a selected level of "H" level while signal WDE is set at "H" level, N-channel MOS transistors 51 to 54 in the column become conductive and bit line pair BL and /BL is connected to write data line pair WDL and /WDL.

Each sense amplifier 55 is activated when sense amplifier activation signals SNL and SPL are set at "L" level and "H" level, respectively and amplifies a micro-potential difference which is generated between corresponding bit lines BL and /BL, to a power supply voltage VCC. Each equalizer 56 is activated when a bit line equalization signal EQ is set at active level of "L" level and precharges corresponding bit lines BL and /BL with a bit line precharge potential VBL (=VCC/2).

Next, the write operation of this DRAM will be described. In a standby state, each word line WL is set at an unselected level of "L" level, each memory cell MC is inactivated, each write column select line WCSL is set at unselected level of "L" level and each write column select gate 50 is set nonconductive. In addition, each equalizer 56 is activated, each bit line pair BL and /BL is precharged with bit line precharge potential VCC/2, sense amplifier activation signals SPL and SNL are set at intermediate level of VCC/2 and each sense amplifier 55 is inactivated. Further, signal WDE is set at "H" level.

First, equalizer 56 is inactivated and word line WL in a row according to a row address signal RA is raised to selected level of "H" level. When the level of word line WL is raised to selected level of "H" level, each memory cell MC corresponding to word line WL is activated and a micropotential difference with a polarity according to the stored data of memory cell MC is generated between bit line pair BL and /BL. Then, sense amplifier activation signals SPL and

2

SNL are set at "H" level and "L" level, respectively, thereby activating sense amplifier 55 and amplifying the potential difference between bit line pair BL and /BL to power supply voltage VCC.

Next, the level of write column select line WCSL in a column according to a column address signal CA is raised to selected level of "H" level, thereby making write column select gate 50 in the column conductive and coupling bit line pair BL and /BL to write data line pair WDL and /WDL in the column. Write data lines WDL and /WDL are set at, for example, "L" level and "H" level in accordance with a write data signal, respectively. Therefore, the levels of bit lines BL and /BL in the selected column are rewritten to those of write data lines WDL and /WDL, respectively. The levels of bit lines BL and /BL in unselected columns are kept as they are. Write column select line WCSL is let fall to unselected level of "L" level after the passage of predetermined time.

Next, word line WL is let fall to unselected level of "L" level, memory cell MC is inactivated, sense amplifier activation signals SPL and SNL are made intermediate level VCC/2, sense amplifier 55 is inactivated, equalizer 56 is activated, and bit line pair BL and /BL is set to have bit line precharge potential VBL. In this way, a data signal is written.

Further, FIG. 15 is a circuit block diagram which shows the main parts of another conventional DRAM. Referring to FIG. 15, this DRAM differs from DRAM shown in FIG. 14 in that write column select gate 50 is replaced by a write column select gate 61. Write column select gate 61 includes N-channel MOS transistors 62 to 65. N-channel MOS transistors 62 and 63 are connected in series between bit line BL and the line of a ground potential GND, and N-channel MOS transistors 64 and 65 are connected in series between bit line /BL and the line of ground potential GND. The gates of N-channel MOS transistors 62 and 64 are both connected to write column select line WCSL and the gates of N-channel MOS transistors 63 and 65 are connected to write data lines /WDL and WDL, respectively.

When the level of write column select line WCSL is raised to selected level of "H" level, N-channel MOS transistors 62 and 64 become conductive. If write data lines WDL and /WDL are at "H" level and "L" level, respectively, then N-channel MOS transistor 65 becomes conductive, N-channel MOS transistor 63 becomes nonconductive, the level of bit line /BL is let fall to "L" level and the level of bit line BL is raised to "H" level by sense amplifier 55. If write data lines WDL and /WDL are at "L" level and "H" level, respectively, then N-channel MOS transistor 63 becomes conductive, N-channel MOS transistor 65 becomes nonconductive, the level of bit line BL is let fall to "L" level and the level of bit line /BL is raised to "H" level by sense amplifier 55. Since the other configurations and operations of DRAM shown in FIG. 15 are the same as those of DRAM shown in FIG. 9, they will not be repeatedly described herein.

Conventional DRAMs have, however, the following disadvantages. In case of DRAM shown in FIG. 14, it is necessary to extend a wiring for write driver enable signal WDE to each write column select gate 50. However, it is difficult to secure a region to provide the wiring for signal WDE in a memory mat in which word lines WL, bit line pairs BL, /BL, write data line pair WDL, /WDL, a read data line pair (not shown), write column select lines WCSL, the line of power supply potential VCC, the line of ground potential GND and the like are complicatedly arranged.

Furthermore, the gates of many N-channel MOS transistors 53 and 54 are connected to respective signal WDE wirings and the load capacitance of each signal WDE wiring increases. As a result, it is necessary to provide a repeater on each signal WDE wiring to change the level of signal WDE at high rate, to hierarchize the signal WDE wiring to reduce consumption current and to secure a region for arranging the repeater and a circuit for changing over hierarchies in the memory mat. The memory mat is thereby disadvantageously divided by such a region and a layout area is disadvantageously made larger.

Moreover, in case of DRAM shown in FIG. 15, the gates of many N-channel MOS transistors 63 and 65 are connected to write data lines WDL and /WDL, respectively, and the load capacitances of write data lines WDL and /WDL increase. Due to this, it is necessary to interpose repeaters on write data lines WDL and /WDL, respectively to change the levels of write data lines WDL and /WDL at high rate, and to secure a region for arranging the repeaters and a circuit for changing hierarchies in the memory mat. The memory mat is thereby disadvantageously divided by such a region and a layout area is disadvantageously made larger.

SUMMARY OF THE INVENTION

It is, therefore, a main object of the present invention to provide a semiconductor memory device having a small layout area, fast write operation and low consumption power.

A semiconductor memory device according to this invention is provided with: a memory cell array including a plurality of memory cells arranged in a plurality of rows and a plurality of columns, a plurality of word lines provided to correspond to the plurality of rows, respectively, and a plurality of bit line pairs provided to correspond to the plurality of columns, respectively; a sense amplifier provided to correspond to each of the bit line pairs, and amplifying a potential difference generated between first and second bit lines included in the corresponding bit line pair; a row decoder selecting one of the plurality of word lines in accordance with a row address signal, and activating the respective memory cells corresponding to the word line; a column decoder selecting one of the plurality of bit line pairs in accordance with a column address signal; a write data line pair provided to be common to the plurality of bit line pairs; a write circuit setting a potential of one of first and second write data lines included in the write data line pair at a first potential and sets the other write data line at a second potential in accordance with a write data signal; and a column select gate connecting the bit line pair selected by the column decoder to the write data line pair. The column select gate includes: first and second transistors of a first conductive type provided to be common to the plurality of bit line pairs, and having input electrodes connected to the first and second write data lines, respectively; and a switching circuit provided to correspond to each of the bit line pairs, and connecting the first and second transistors between the first bit line and the second bit line included in the corresponding bit line pair and a line of the first potential, respectively, in response to selection of the corresponding bit line pair by said column decoder. Therefore, since the first and second transistors for transmitting the potential difference between the write data line pair to the bit line pair are provided to be common to a plurality of bit line pairs, the number of transistors is small and a layout area is small compared with a conventional semiconductor memory device in which the first an second transistors are provided for each bit line pair. In addition, since the load capacitance of the write data line pair is reduced, it is possible to accelerate write operation and to reduce consumption power.

Further, another semiconductor memory device according to this invention is provided with: a memory cell array including a plurality of memory cells arranged in a plurality of rows and a plurality of columns, a plurality of word lines provided to correspond to the plurality of rows, respectively, and a plurality of bit line pairs provided to correspond to the plurality of columns, respectively and divided into groups each consisting of N bit line pairs in advance, where N is an integer not smaller than 2; a sense amplifier provided to correspond to each of the bit line pairs, and amplifying a potential difference generated between first and second bit lines included in the corresponding bit line pair; a row decoder selecting one of the plurality of word lines in accordance with a row address signal, and activating the respective memory cells corresponding to the word line; a column decoder selecting one of a plurality of bit line pair groups in accordance with a column address signal; N write data line pairs provided to be common to the plurality of bit line pair groups, and provided to correspond to the N bit line pairs belonging to each bit line pair group; a write circuit provided to correspond to each of the write data line pairs, setting a potential of one of first and second write data lines included in the write data line pair at a first potential and the potential of the other write data line at a second potential in accordance with a write data signal; and a column select gate connecting the N bit line pairs belonging to the bit line pair group selected by the column decoder to the N write data line pairs. The column select gate includes: first and second transistors of a first conductive type provided to correspond to each of the bit line pairs, and having input electrodes connected to the corresponding first and second write data lines, respectively, and having first electrodes connected to the first and second bit lines included in the corresponding bit line pair, respectively; and a switching circuit provided to correspond to each of the bit line pair groups, and connecting a second electrode of each of the corresponding first and second transistors to a line of the first potential, in response to selection of the corresponding bit line pair group by said column decoder. Therefore, since the switching circuit connected between the second electrode of each of the first and second transistor and the line of the first potential is provided to be common to not less than two bit line pairs, the number of transistors is small and a layout area is small compared with a conventional semiconductor memory device in which the switching circuit is provided for each bit line pair. In addition, since the load capacitance of the column select line is reduced, it is possible to accelerate write operation and to reduce consumption power.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
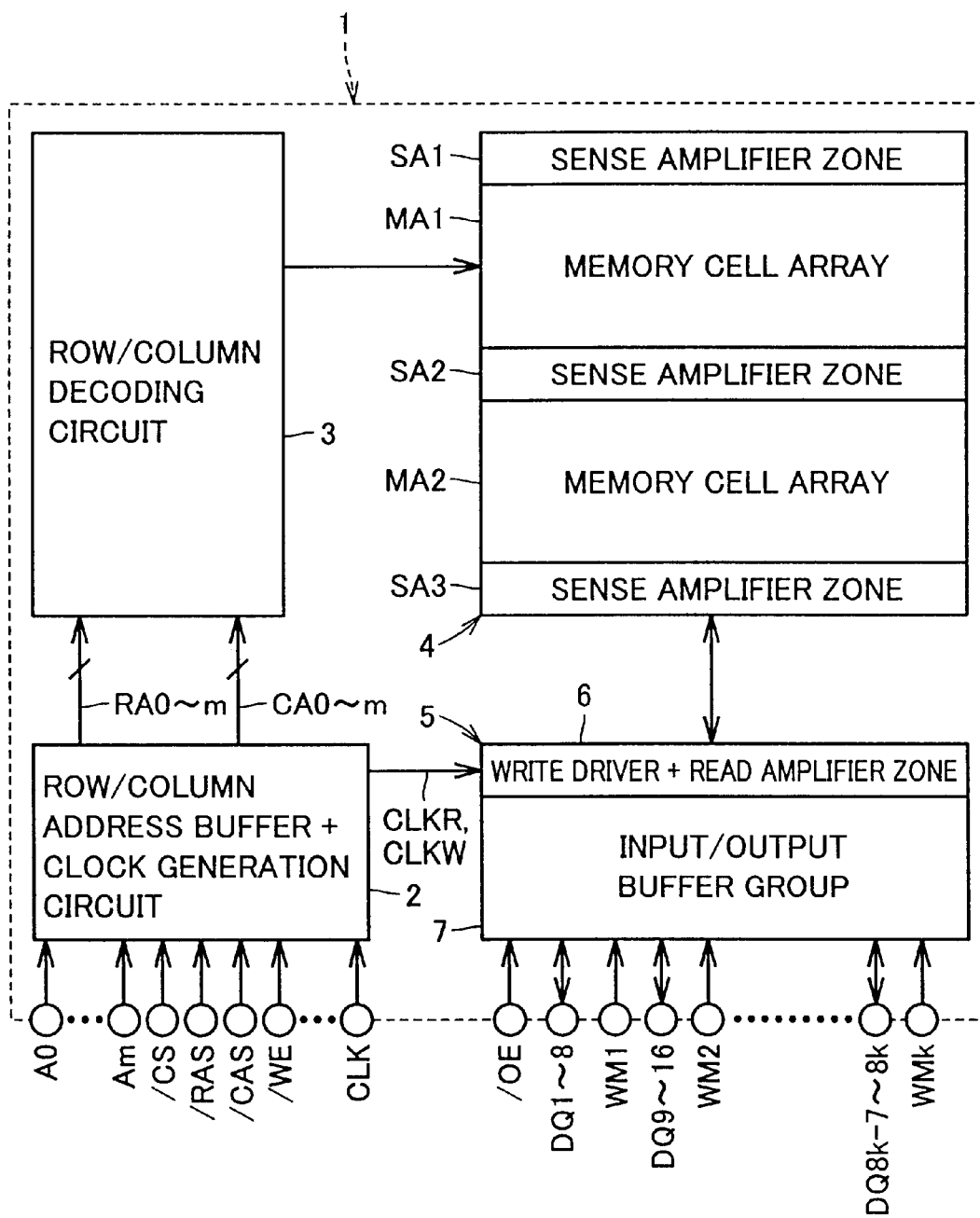
FIG. 1 is a block diagram showing the entire configuration of DRAM according to the first embodiment of the present invention.

FIG. 1 is a block diagram which shows the entire configuration of a DRAM 1 according to the first embodiment of the present invention. In FIG. 1, DRAM 1 includes a row/column address buffer+clock generation circuit 2, a row/column decoding circuit 3, a memory mat 4 and a data input/output circuit 5. DRAM 1 is capable of simultaneously inputting/outputting 8 k data signals DQ1 to DQ8k (where k is an integer not smaller than 1) and the input terminal of one write mask signal WM is provided for each of the eight data signals.

Row/column address buffer+clock generation circuit 2 generates row address signals RA0 to RAm and column address signals CA0 to CAm in accordance with address signals A0 to Am applied from the outside of DRAM 1 (where m is an integer not smaller than 0) and applies row address signals RA0 to RAm and column address signals CA0 to CAm to row/column decoding circuit 3. In addition, row/column address buffer+clock generation circuit 2 generates a read clock signal CLKR, a write clock signal CLKW and the like in accordance with external control signals /CS, /RAS, /CAS, /WE, . . . and an external clock signal CLK and thereby controls the entirety of DRAM 1.

Memory mat 4 includes a plurality of (three in FIG. 1) sense amplifier zones SA1 to SA3, and memory arrays MA1 and MA2 arranged between the sense amplifier zones, respectively. Each of memory arrays MA1 and MA2 includes a plurality of memory cells each of which stores one data signal. The plural memory cells are divided into groups each consisting of the preset number 8 k of memory cells. Each memory cell group is arranged at predetermined address determined by row and column addresses.

Row/column decoding circuit 3 designates the addresses of memory arrays MA1 and MA2, respectively, in accordance with row address signals RA0 to RAm and column address signals CA0 to CAm applied from row/column address buffer+clock generation circuit 2. Each of sense amplifier zones SA1 and SA2 is provided with a sense amplifier+input/output control circuit group to be described later. The sense amplifier+input/output control circuit group connects 8 k memory cells at the addresses designated by row/column decoding circuit 3 to data input/output circuit 5. Data input/output circuit 5 includes a write driver+read amplifier zone 6 and an input/output buffer group 7. Write driver+read amplifier zone 6 is provided with a write driver group and a read amplifier group.

The read amplifier group operates synchronously with read clock signal CLKR and applies read data signals Q1 to Q8k from the selected 8 k memory cells to input/output buffer group 7. Input/output buffer group 7 outputs read data signals Q1 to Q8k from the read amplifier zone to the outside of DRAM 1 in response to an external control signal /OE. The write driver group operates synchronously with write clock signal CLKW and writes external write data signals D1 to D8k to the selected 8 k memory cells, respectively. It is noted, however, that no data is written to memory cells, among the 8 k memory cells, designated by write mask signals WM1 to WMk.

Figure 2:
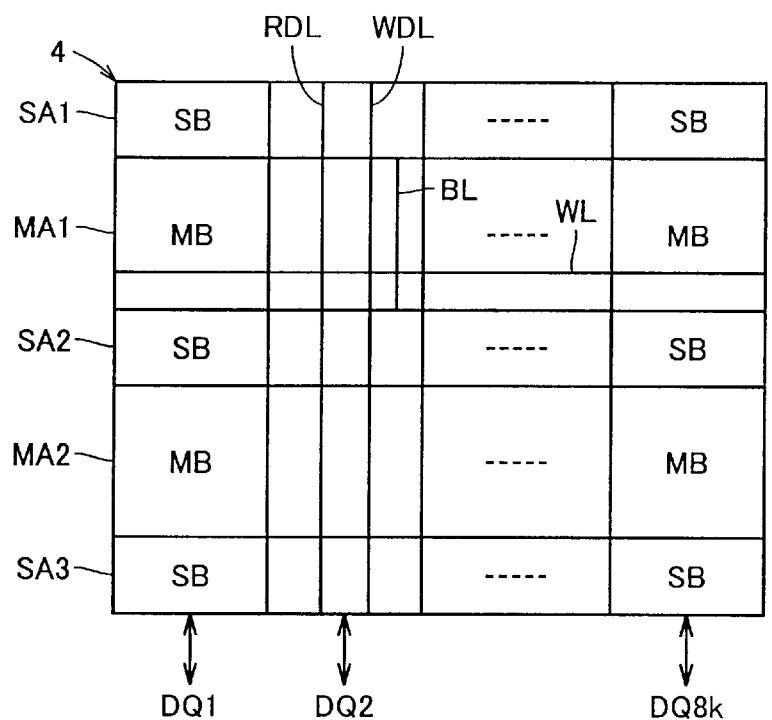
FIG. 2 is a block diagram showing the configuration of a memory mat shown in FIG. 1.

FIG. 2 is a block diagram which shows the configuration of memory mat 4 shown in FIG. 1. In FIG. 2, each of memory arrays MA1 and MA2 is divided into 8 k memory blocks MB corresponding to data signals DQ1 to DQ8k, respectively. In addition, each of sense amplifier zones SA1 to SA3 is divided into 8 k sense blocks SB corresponding to data signals DQ1 to DQ8k, respectively.

Memory mat 4 includes 8 k read data line pairs RDL and /RDL for reading data signals Q1 to Q8k, respectively, and 8 k write data line pairs WDL and /WDL for writing data signals D1 to D8k, respectively. Each of read data line pairs RDL, /RDL and write data line pairs WDL, /WDL is arranged to cross corresponding three sense blocks SB and two memory blocks MB and one end thereof is connected to write driver+read amplifier zone 6.

Figure 3:
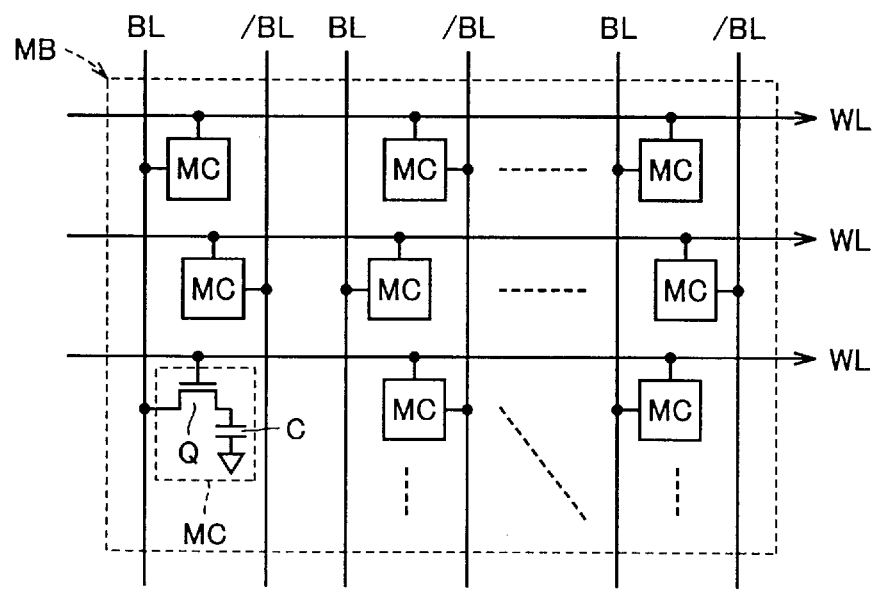
FIG. 3 is a circuit block diagram showing the configuration of a memory block shown in FIG. 2.

As shown in FIG. 3, each memory block MB includes a plurality of memory cells MC arranged in a plurality of rows and columns, a plurality of word lines WL provided to correspond to the plural rows, respectively, and a plurality of bit line pairs BL and /BL provided to correspond to the plural columns, respectively. Memory cell MC is a well-known memory cell which includes an N-channel MOS transistor Q for access and a capacitor C for information storage.

If the level of word line WL is set at selected level of "H" level, each memory cell MC in the row corresponding to word line WL is activated to thereby enable data to be written/read to and from each memory cell MC. During a write operation, one word line WL is set at selected level of "H" and corresponding memory cells MC are activated. Thereafter, one bit line in one bit line pair BL and /BL is set at selected level of "H" level and the other bit line is set at "L" level in accordance with a corresponding write data signal (e.g., D1). As a result, the potential of the bit line is written to desired memory cell MC.

During a read operation, after the potentials of bit line pairs BL and /BL are equalized to bit line precharge potential VBL (=VCC/2), one word line WL is set at selected level of "H" and corresponding memory cells MC are activated. As a result, a micro-potential difference according to the stored data of each memory cell MC is generated between each bit line pair BL and /BL. The micro-potential difference between each bit line pair BL and /BL is amplified to power supply potential VCC and then the potential difference of one bit line pair BL and /BL is detected, whereby a data signal can be read from desired memory cell MC.

Figure 4:
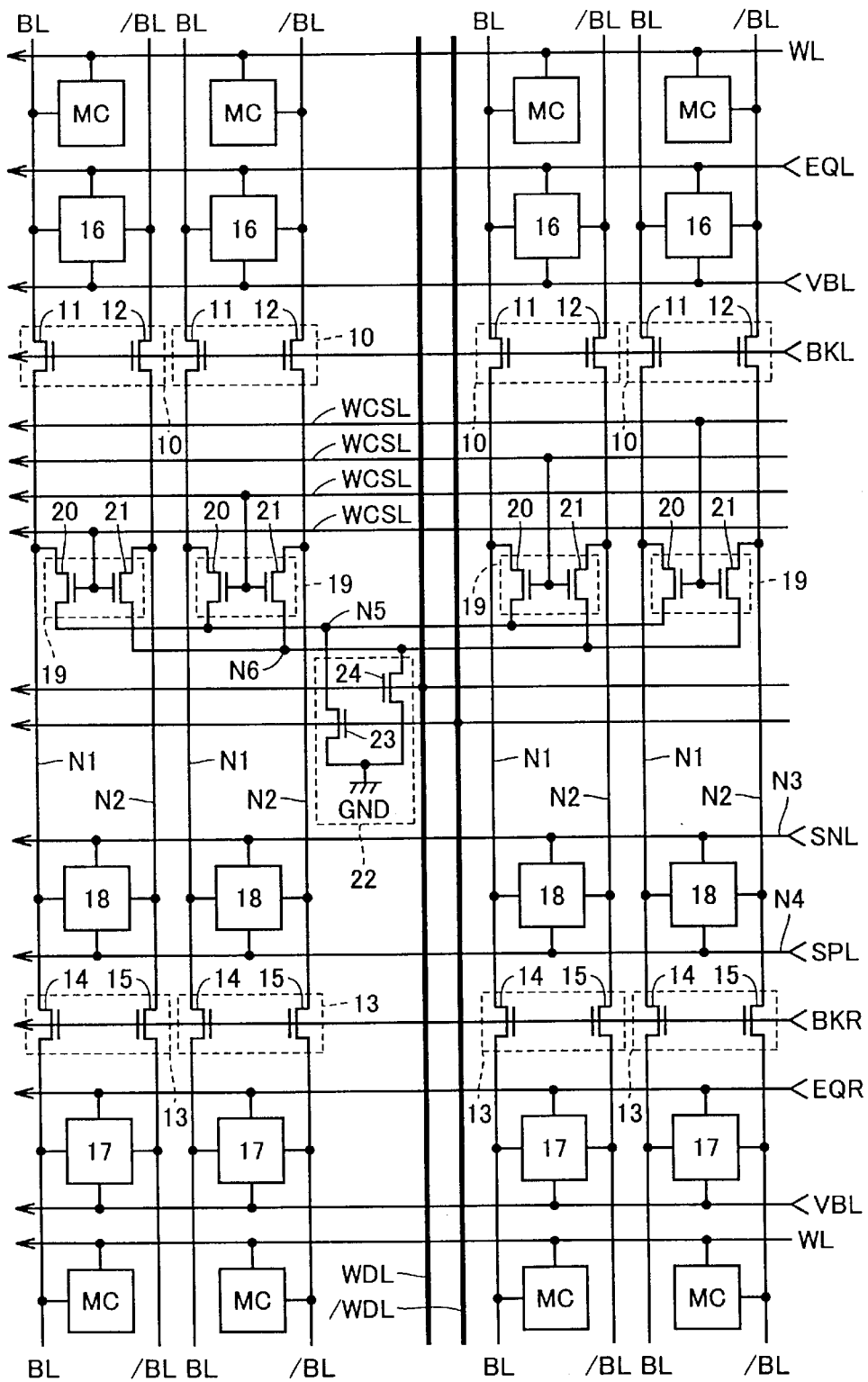
FIG. 4 is a circuit block diagram showing the main parts of a sense block in a sense amplifier zone SA2 shown in FIG. 2.

FIG. 4 is a circuit block diagram which shows the main parts of sense block SB in sense amplifier zone SA2. In FIG. 4, sense block SB in sense amplifier zone SA2 includes transfer gates 10 and 13, equalizers 16 and 17, sense amplifiers 18, write column select gates 19 and write column select lines WCSL provided to correspond to bit line pairs BL and /BL of two memory blocks MB and MB, respectively as well as a driver circuit 22 which are provided to be common to not less than two predetermined number of (four in FIG. 4) columns. Each transfer gate 10 includes a pair of N-channel MOS transistors 11 and 12 which are connected between corresponding bit lines BL, /BL of memory block MB in memory cell array MA1 and nodes N1, N2, respectively, and each of which transistors has a gate receiving a signal BKL. Each transfer gate 13 includes a pair of N-channel MOS transistors 14 and 15 which are connected between corresponding bit lines BL, /BL of memory block MB in memory cell array MA2 and nodes N1, N2, respectively, and each of which transistors has a gate receiving a signal BKR.

When signal BKL out of signals BKL and BKR is set at "L" level by row/column decoding circuit 3, two N-channel MOS transistors 11 and 12 of each transfer gate 10 become nonconductive and each bit line pair BL, /BL in memory cell array MA1 is disconnected from nodes N1, N2, respectively. When signal BKR out of signals BKL and BKR is set at "L" level by row/column decoding circuit 3, two N-channel MOS transistors 14 and 15 of each transfer gate 13 become nonconductive and each bit line pair BL, /BL in memory cell array MA2 is disconnected from nodes N1, N2, respectively.

Each equalizer 16 is connected to each bit line pair BL and /BL of memory array MA1 and equalizes corresponding bit line pair BL and /BL to bit line precharge potential VBL (=VCC/2) when bit line equalization signal EQL is set at active level of "L" level.

Figure 5:
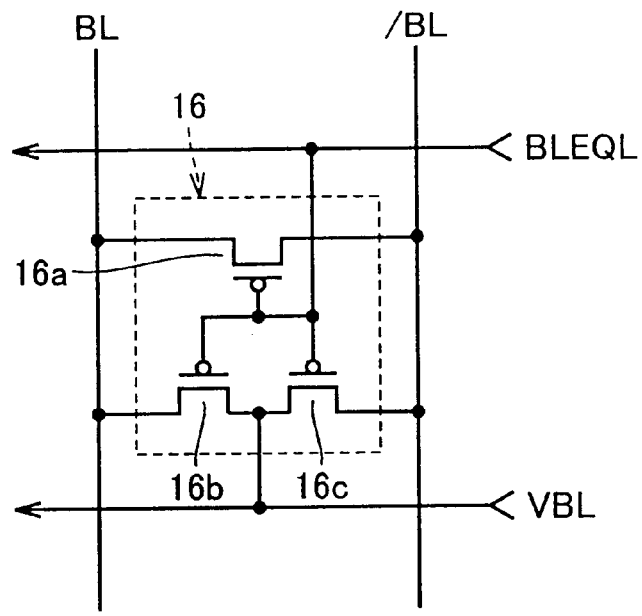
FIG. 5 is a circuit block diagram showing the configuration of an equalizer shown in FIG. 4.

That is, as shown in FIG. 5, each equalizer 16 includes P-channel MOS transistors 16a to 16c. P-channel MOS transistor 16a is connected between bit line pair BL and /BL and P-channel MOS transistors 16b and 16c are connected in series between bit lines BL and /BL. Bit line equalization signal EQL is applied to the gate of each of P-channel MOS transistors 16a to 16c. Bit line precharge potential VBL is applied to the node between P-channel MOS transistors 16b and 16c.

When bit line equalization signal EQL is set at active level of "L" level by row/column decoding circuit 3, P-channel MOS transistors 16a to 16c become conductive and the potentials of bit lines BL and /BL are both set at bit line precharge potential VBL. When bit line equalization signal EQL is set at inactive level of "H" level by row/column decoding circuit 3, P-channel MOS transistors 16a to 16c become nonconductive and the equalization of bit lines BL and /BL is stopped.

Referring back to FIG. 4, each equalizer 17 is connected to bit line pair BL and /BL of memory cell array MA2 and equalizes corresponding bit line pair BL and /BL when bit line equalization signal EQR is set at active level of "L" level. Equalizer 17 is the same in configuration as equalizer 16.

Figure 6:
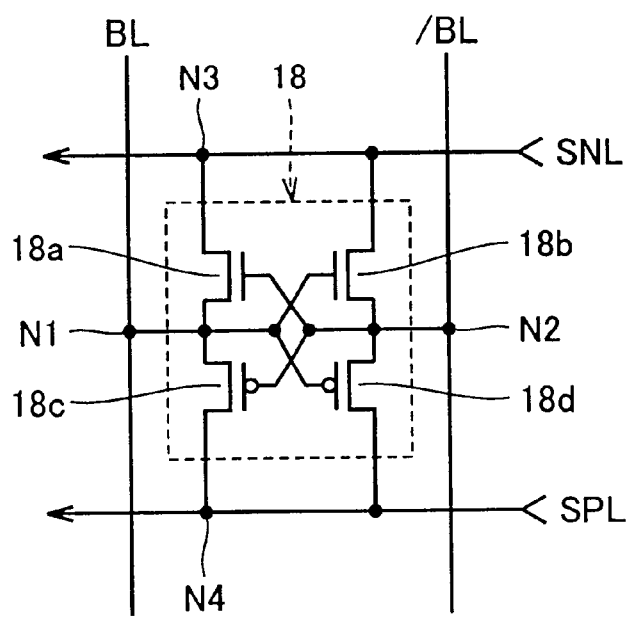
FIG. 6 is a circuit diagram showing the configuration of a sense amplifier shown in FIG. 4.

Each sense amplifier 18 is activated when sense amplifier activation signals SNL and SPL are set at "L" level and "E" level, respectively, and amplifies a micro-potential difference generated between nodes N1 and N2 to power supply voltage VCC. Namely, as shown in FIG. 6, each sense amplifier 18 includes N-channel MOS transistors 18a and 18b and P-channel MOS transistors 18c and 18d. N-channel MOS transistors 18a and 18b are connected between nodes N3 and N1 and between nodes N3 and N2, respectively and the gates thereof are connected to nodes N2 and N1, respectively. P-channel MOS transistors 18c and 18d are connected between nodes N1 and N4 and between nodes N2 and N4, respectively and the gates thereof are connected to nodes N2 and N1, respectively. Sense amplifier activation signals SNL and SPL are applied to nodes N3 and N4, respectively. Sense amplifier activation signals SNL and SPL are generated by row/column decoding circuit 3, both set at intermediate level (VCC/2) in a standby state and set at "L" level and "H" level, respectively in an active state.

In the standby state, nodes N1 to N4 are all set at intermediate level VCC/2 and both of MOS transistors 18a and 18d become nonconductive. In the active state, the micro-potential difference generated between bit line pair BL and /BL is transmitted between nodes N1 and N2 and nodes N3 and N4 are set at "L" level and "H" level, respectively.

If the potential of node N1 is higher than that of node N2, then the resistance values of MOS transistors 18b and 18c become lower than those of MOS transistors 18a and 18d, the potential of node N1 is raised up to power supply potential VCC and that of node N2 is lowered down to ground potential GND. If the potential of node N2 is higher than that of node N1, then the resistance values of MOS transistors 18a and 18d become lower than those of MOS transistors 18b and 18c, the potential of node N2 is raised up to power supply potential VCC and that of node N1 is lowered down to ground potential GND.

Each write column select gate 19 includes N-channel MOS transistors 20 and 21. N-channel MOS transistors 20 and 21 are connected between nodes N1 and N5 and between N2 and N6, respectively and the gates thereof are all connected to write column select line WCSL in the corresponding column. Driver circuit 22 includes N-channel MOS transistors 23 and 24. N-channel MOS transistors 23 and 24 are connected between node N5 and the line of ground potential GND and node N6 and the line of ground potential GND, respectively and the gates thereof are connected to write data lines /WDL and WDL, respectively. Write column select line WCSL is provided to correspond to each column "L" and to be common to 8 k sense blocks SB in sense amplifier zone SA2.

When write column select line WCSL in each of the columns corresponding to column address signals CA0 to Can, respectively, is set at selected level of "H" level by row/column decoding circuit 3, N-channel MOS transistors 20 and 21 of write column select gate 19 in the column become conductive. If write data lines WDL and /WDL are at "H" level and "L" level, respectively, then N-channel MOS transistor 24 out of N-channel MOS transistors 23 and 24 becomes conductive, nodes N2 and N6 are both set at "L" level and node N1 is set at "H" level by sense amplifier 18. If write data lines WDL and /WDL are at "L" level and "H" level, respectively, then N-channel MOS transistor 23 out of N-channel MOS transistor 23 and 24 becomes conductive, nodes N1 and N5 are both set at "L" level and node N2 is set at "H" level by sense amplifier 18.

Sense block SB in sense amplifier zone SA1 is constituted so that transfer gates 10 and 13 and equalizers 17 for memory cell array MA2 are removed from sense block SB in sense amplifier zone SA2. Sense block SB in sense amplifier zone SA3 is constituted so that transfer gates 10 and 13 and equalizers 16 for memory cell array MA1 are removed from sense block SB in sense amplifier zone SA2.

It is noted that column select lines RSCL and WCSL for sense amplifier zone SA1 are provided separately from those for sense amplifier zone SA3.

Next, the write operation of this DRAM will be described. In a standby state, each word line WL is set at unselected level of "L" level, each memory cell MC is inactivated, each write column select line WCSL is set at unselected level of "L" level and N-channel MOS transistors 20 and 21 of each write column select gate 19 are set nonconductive. In addition, equalizers 16 and 17 are activated, bit line pairs BL and /BL are all precharged with bit line precharge potential VCC/2, sense amplifier activation signals SPL and SNL are both set at intermediate level of VCC/2 and each sense amplifier 18 is inactivated. Further, signals BKL and BKR are both set at "H" level, transfer gates 10 and 13 are set nonconductive.

A write command, row address signals RA0 to RAm and column address signals CA0 to CAn are inputted synchronously with clock signal CLK. It is assumed herein that memory array MA1 is selected by row address signals RA0 to RAm. As a result, signal BLIR is set at "L" level, each transfer gate 13 is set conductive, and each sense amplifier 18 is disconnected from memory array MA2. Further, each equalizer 16 is inactivated and the levels of word lines WL in rows according to row address signals RA0 to RAm are raised to selected level of "H" level. As a result, memory cells MC corresponding to word lines WL are activated and micro-potentials with a polarity corresponding to the stored data of memory cells MC are generated between bit line pairs BL and /BL, respectively.

Next, the levels of write column select lines WCSL corresponding to column address signals CA0 to CAn are raised to selected level of "H" level, and N-channel MOS transistors 20 and 21 of each write column select gate 19 in the columns become conductive. Write data lines WDL and /WDL are set at, for example, "H" level and "L" level in advance in accordance with a write data signal, respectively. Accordingly, the level of bit line BL or /BL in each selected column is lowered to "L" level.

Next, sense amplifier activation signals SPL and SNL are set at "H" level and "L" level, respectively, each sense amplifier 18 is activated and the potential difference between corresponding bit line pair BL and /BL is amplified to power supply potential VCC. Accordingly, the levels of bit lines BL and /BL in each selected column are maintained to be the levels of write data lines WDL and /WDL, respectively. The levels of bit lines BL and /BL in each unselected column are maintained as they are. Each write column select line WCSL is lowered to unselected level of "L" after the passage of predetermined time.

Finally, each word line WL is let fall to unselected level of "L" level to inactivate corresponding memory cells MC, sense amplifier activation signals SPL and SNL are set at intermediate level of VCC/2 to thereby inactivate each sense amplifier 18 and to activate each equalizer 16, and the potentials of bit lines BL and /BL are both set at bit line precharge potential VBL. Further, signal BKR is set at "H" level, each transfer gate 13 becomes conductive and the DRAM returns to the standby state.

During a read operation, a read command instead of the write command is applied and a read column select line (not shown) instead of write column select line WCSL is selected. The potential difference between bit line pair BL and /BL in each selected column is amplified by sense amplifier 18 and the amplified potential difference is applied through a read column select gate (not shown) to a read data line pair RDL and /RDL. A read amplifier compares the potential of read data line RDL with that of read data line /RDL and outputs a data signal at a logical level according to the comparison result to the outside of DRAM 1 through the input/output buffer.

Figure 15:
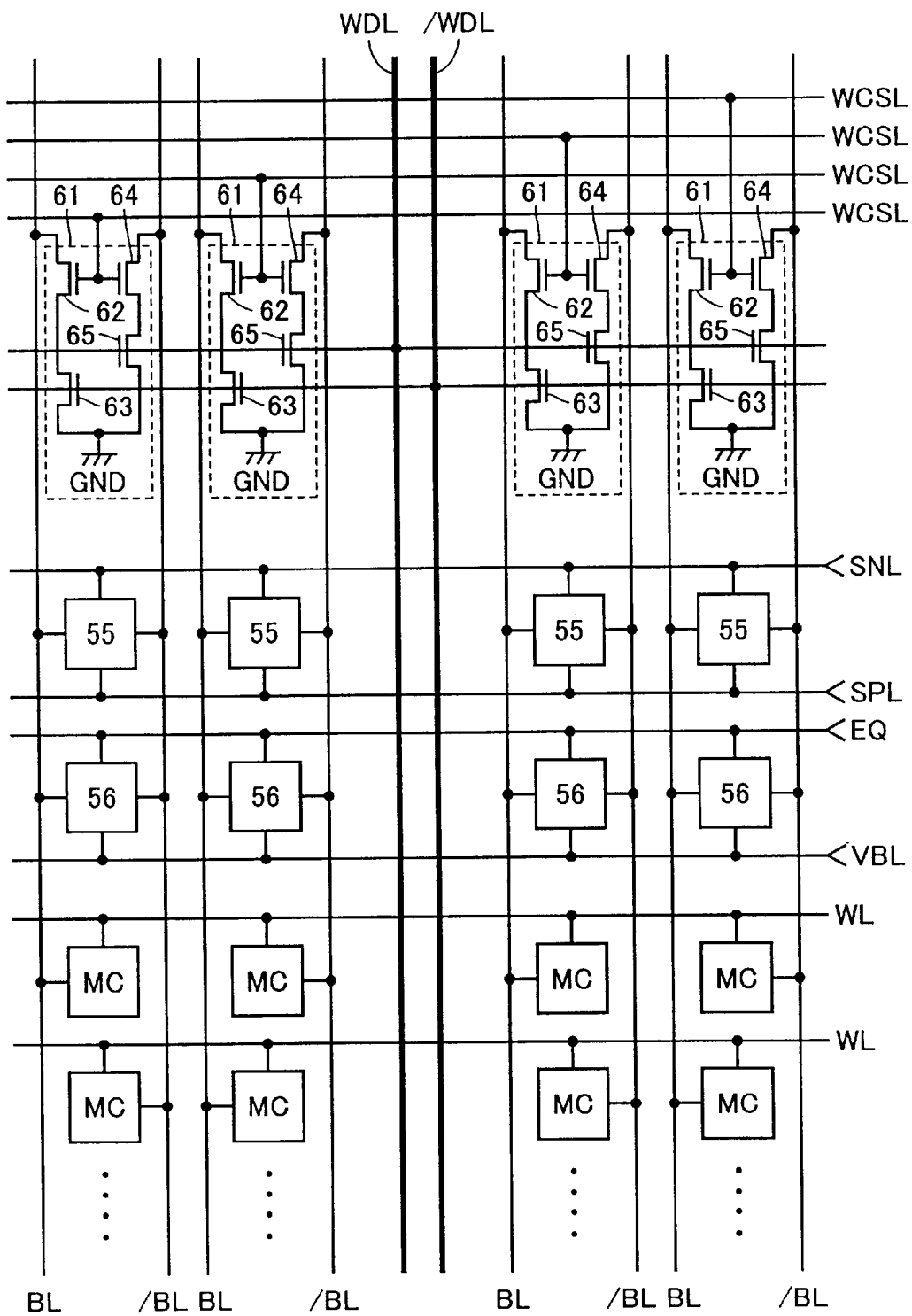
FIG. 15 is a circuit block diagram showing the main parts of another conventional DRAM.

In the first embodiment, since N-channel MOS transistors 23 and 24 for writing the data of write data line pair WDL and /WDL to bit line pair BL and /BL are common to a plurality of columns, the number of N-channel MOS transistors is smaller than that of N-channel MOS transistors 63 and 65 of DRAM shown in FIG. 15 in which such N-channel MOS transistors are provided for each column, thereby making the layout area of DRAM smaller than that of DRAM shown in FIG. 15. In case of DRAM shown in FIG. 15, for example, the number of N-channel MOS transistors of write column select gates 61 corresponding to four columns is 16 while the number of N-channel MOS transistors of write column select gates 19 and of driver circuit 22 in the first embodiment is 10. It is, therefore, possible to reduce the layout area of DRAM by as much as the area of six N-channel MOS transistors.

In addition, the number of N-channel MOS transistors driven by write data lines WDL and /WDL is ¼ times as large as that of N-channel MOS transistors of DRAM shown in FIG. 15, whereby the load capacitances of write data lines WDL and /WDL are reduced to make it possible to accelerate write operation and to reduce consumption power.

Furthermore, from a different viewpoint, in this first embodiment, if DRAM is permitted to occupy the same layout area as that of DRAM shown in FIG. 15, it is possible to widen the channel width of each of N-channel MOS transistors 20, 21, 23 and 24. This is because the number of N-channel MOS transistors in DRAM in the first embodiment is smaller than that of N-channel MOS transistors in DRAM shown in FIG. 15. It is, therefore, possible to drive bit line pairs BL and /BL more strongly and to further accelerate write operation. In addition, if the channel width of each N-channel MOS transistors 20, 21, 23 and 24 is large, it is possible to drive bit lines BL and /BL strongly even when "H" level of write data lines WDL and /WDL is low, which DRAM is thereby suitable even for low voltage operation.

Second Embodiment

Figure 7:
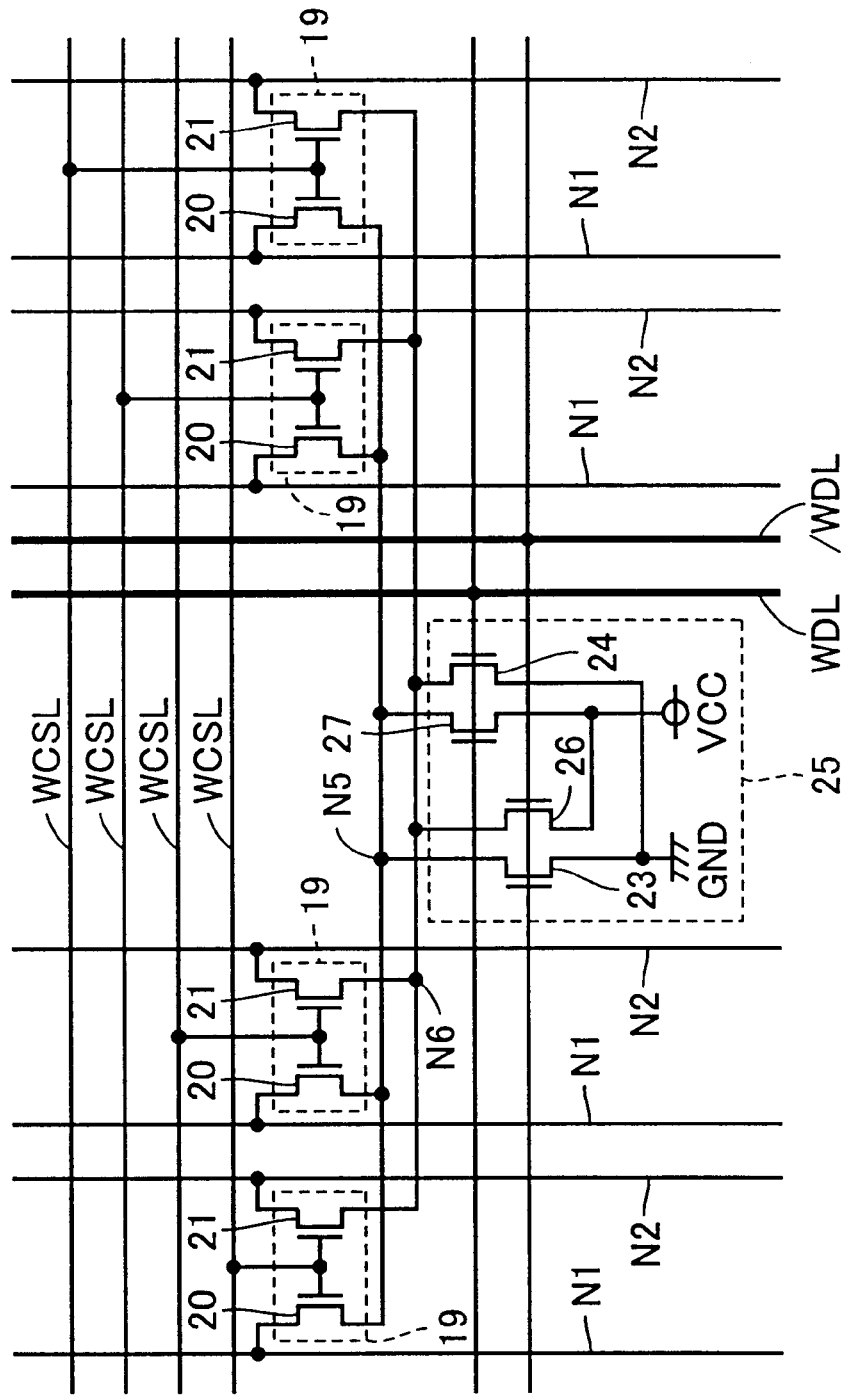
FIG. 7 is a circuit diagram showing the main parts of DRAM according to the second embodiment of the present invention.

FIG. 7 is a circuit diagram which shows the main parts of DRAM according to the second embodiment of the present invention, which diagram is compared with FIG. 4. Referring to FIG. 7, this DRAM differs from DRAM shown in FIG. 4 in that driver circuit 22 is replaced by a driver circuit 25.

Driver circuit 25 is constituted so that N-channel MOS transistors 26 and 27 are added to driver circuit 22. N-channel MOS transistors 26 and 27 are connected between node NG and the line of power supply voltage VCC and node N5 and the line of power supply voltage VCC, respectively, and the gates thereof are connected to write data lines /WDL and WDL, respectively.

When the level of write column select line WCSL in each of the columns according to column address signals CA0 to CAm is raised to selected level of "H" level, N-channel MOS transistors 20 and 21 of each write column select gate 19 in the column become conductive and nodes N1 and N2 are connected to nodes N5 and N6 in the column, respectively.

If write data lines WDL and /WDL are at "H" level and "L" level, respectively, then N-channel MOS transistors 24 and 27 become conductive, N-channel MOS transistors 23 and 26 become nonconductive and the levels of nodes N1 and N5 are both raised to "H" level (power supply potential VCC) and those of nodes N2 and N6 are both let fall to "L" level (ground potential GND).

If write data lines WDL and JWDL are at "L" level and "H" level, respectively, then N-channel MOS transistors 23 and 26 become conductive, N-channel MOS transistors 24 and 27 become nonconductive, the levels of nodes N2 and N6 are both raised to "H" level and those of nodes N1 and N5 are both let fall to "L" level.

In this second embodiment, since the level of one of nodes N5 and N6 is raised to "H" level and that of the other node is let fall to "L" level by driver circuit 25, it is possible to further accelerate write operation compared with the first embodiment in which node N5 or N6 is both let fall to "L" level by driver circuit 22. In addition, eve if power supply voltage VCC is lowered, it is possible to correctly write data.

Figure 8:
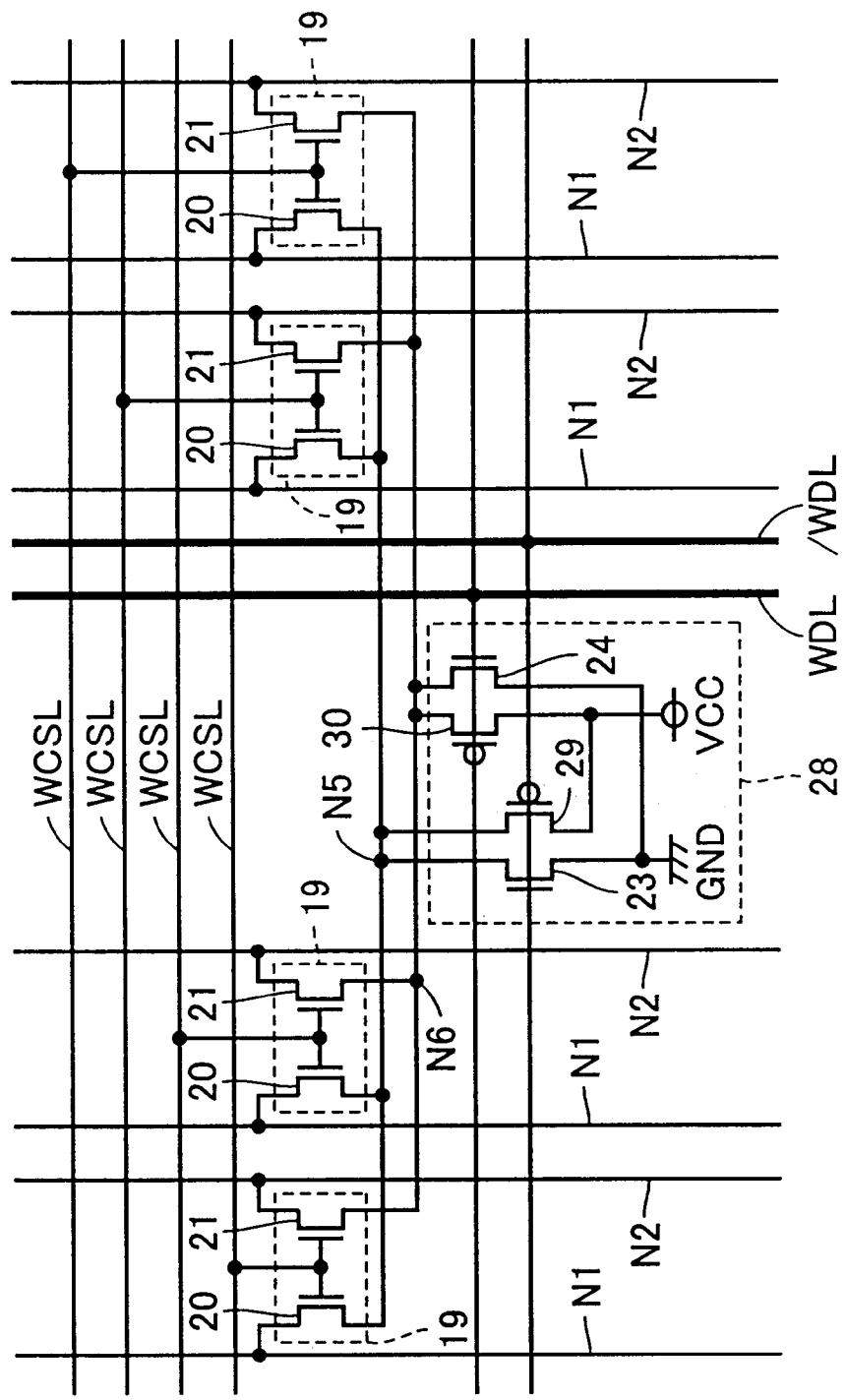
FIG. 8 is a circuit diagram showing a modification of the second embodiment.

In a modification shown in FIG. 8, driver 25 is replaced by a driver circuit 28. Driver circuit 28 is constituted so that N-channel MOS transistors 26 and 27 of driver circuit 25 are replaced by P-channel MOS transistors 29 and 30, respectively. P-channel MOS transistors 29 and 30 are connected between node N5 and the line of power supply potential VCC and between node N6 and the line of power supply potential VCC, respectively, and the gates thereof are connected to write data lines /WDL and WDL, respectively.

If write data lines WDL and /WDL are at "H" level and "L" level, respectively, then N-channel MOS transistor 24 and P-channel MOS transistor 29 become conductive, N-channel MOS transistor 23 and P-channel MOS transistor 30 become nonconductive, the levels of nodes N1 and N5 are both raised to "H" level and those of nodes N2 and N6 are both let fall to "L" level. If write data lines WDL and /WDL are at "L" level and "H" level, respectively, N-channel MOS transistor 23 and P-channel MOS transistor 30 become conductive, N-channel MOS transistor 24 and P-channel MOS transistor 29 become nonconductive, the levels of nodes N2 and N6 are both raised to "H" level and those of nodes N1 and N5 are both let fall to "L" level. This modification can obtain the same advantage as that of DRAM shown in FIG. 8.

Third Embodiment

Figure 9:
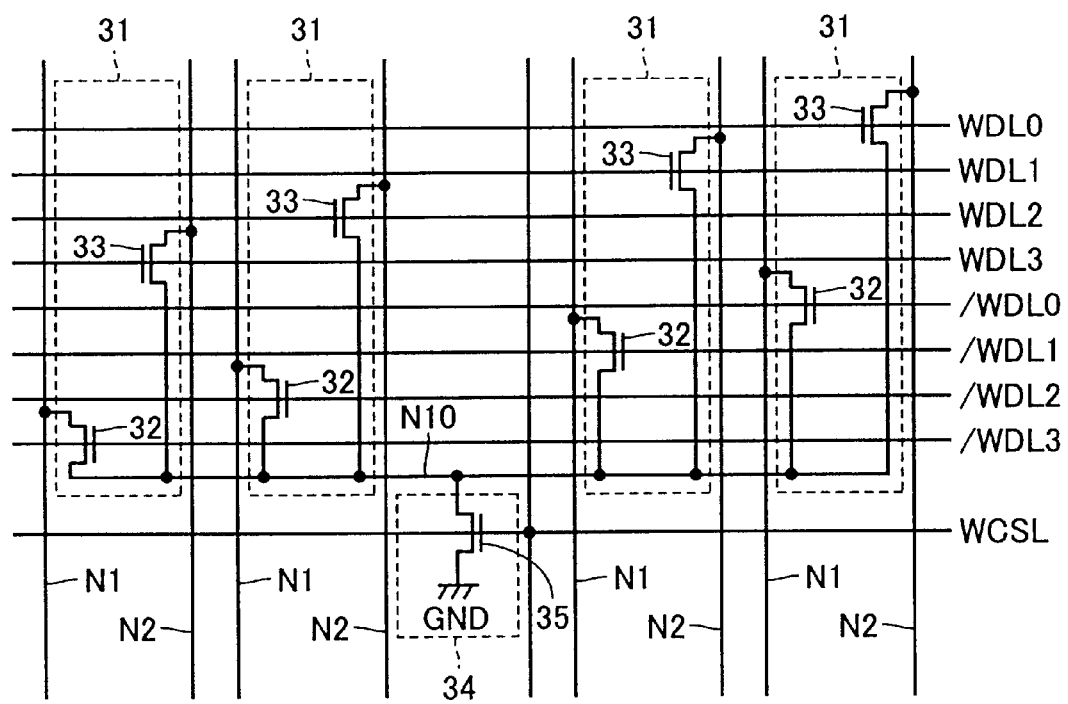
FIG. 9 is a circuit diagram showing the main parts of DRAM according to the third embodiment of the present invention.

FIG. 9 is a circuit diagram which shows the main parts of sense amplifier zone SA2 of DRAM according to the third embodiment of the present invention, which diagram is compared with FIG. 4. Referring to FIG. 9, this DRAM differs from DRAM shown in FIG. 4 in that each write column select gate 19 and driver circuit 22 are replaced by a write column select gate 31 and a driver circuit 34, respectively.

Driver circuit 34 is provided to be common to not more than two predetermined number of (four in FIG. 9) columns in sense block SB. Driver circuit 34 includes an N-channel MOS transistor 35. N-channel MOS transistor 35 is connected between a node N10 and the line of ground potential GND and the gate thereof is connected to write column select lines WCSL for the corresponding columns. Each write column select gate 31 includes N-channel MOS transistors 32 and 33. N-channel MOS transistors 32 and 33 are connected between corresponding nodes N1 and N10 and between corresponding nodes N2 and N10, respectively and the gates thereof are connected to corresponding write data lines /WDL and WDL, respectively.

When the level of write column select line WCSL in each of the columns according to column address signals CA0 to CAm is raised to "H" level, N-channel MOS transistor 35 of driver circuit 34 in the column becomes conductive and the level of node N10 is let fall to ground potential GND.

If write data lines WDL and /WDL are at "H" level and "L" level, respectively, then N-channel MOS transistor 33 becomes conductive, N-channel MOS transistor 32 becomes nonconductive and the level of node N2 is let fall to "L" level. If write data lines WDL and JWDL are at "L" level and "H" level, respectively, then N-channel MOS transistor 32 becomes conductive, N-channel MOS transistor 33 becomes nonconductive and the level of node N1 is let fall to "L" level.

This third embodiment can obtain the same advantage as that of the first embodiment, as well.

Fourth Embodiment

Figure 10:
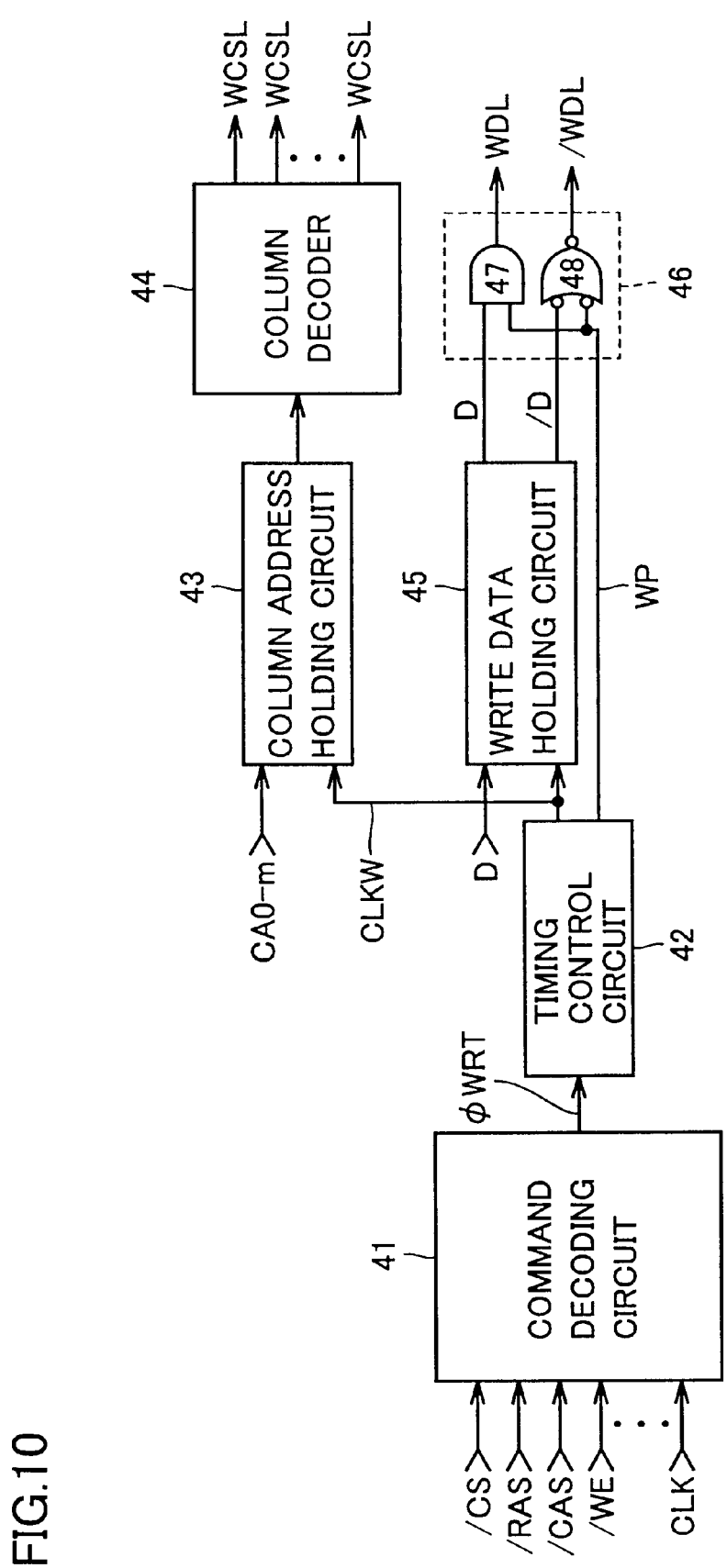
FIG. 10 is a circuit block diagram showing parts related to the write operation of DRAM according to the fourth embodiment of the present invention.

FIG. 10 is a circuit block diagram which shows parts related to the write operation of DRAM according to the fourth embodiment of the present invention. In FIG. 10, this DRAM includes a command decoding circuit 41, a timing control circuit 42, a column address holding circuit 43, a column decoder 44, a write data holding circuit 45 and a write driver 46.

Command decoding circuit 41 and timing control circuit 42 are included in row/column address buffer+clock generation circuit 2 shown in FIG. 1. Command decoder 41 generates a signal ØWRT in response to the input of a write command WRT by external control signals /CS, /RAS, /CAS, /WE, ... and clock signal CLK, and applies signal ØWRT to timing control circuit 42. Timing control circuit 42 generates a write clock signal CLKW and a write pulse signal WP in response to signal ØWRT applied from command decoding circuit 41. Write clock signal CLKW is applied to column address holding circuit 43 and write data holding circuit 45, respectively, and write pulse signal WP is applied to write driver 46.

Column address holding circuit 43 and column decoder 44 are included in row/column decoding circuit 3 shown in FIG. 1. Column address holding circuit 43 fetches column address signals CA0 to CAm in response to the rising edge of write clock signal CLKW. Column decoder 44 selects one of a plurality of write column select lines WCSL in accordance with column address signals CA0 to CAm fetched and held by column address holding circuit 43, and sets the level of selected write column select line WCSL at selected level of "H" level.

Write data holding circuit 45 and write driver 46 are included in write driver+read amplifier zone 6 shown in FIG. 1. Write data holding circuit 45 fetches a write data signal D in response to the rising edge of write clock signal CLKW and holds and outputs fetched write data signal D and the inversion signal /D of signal D. Write driver 46 includes two AND gates 47 and 48. AND gate 47 receives write data signal D and write pulse signal WP and applies an AND signal of signals D and WP to write data line WDL. AND gate 48 receives write data signal /D and write pulse signal WP and applies an AND of signals /D and WP to write data line /WDL. Therefore, while write pulse signal WP is at "L" level, the levels of write data lines WDL and JWDL are both fixed to "L" level. While write pulse signal WP is at "H" level, data signals D and /D are transmitted to write data lines WDL and /WDL, respectively.

Figure 11:
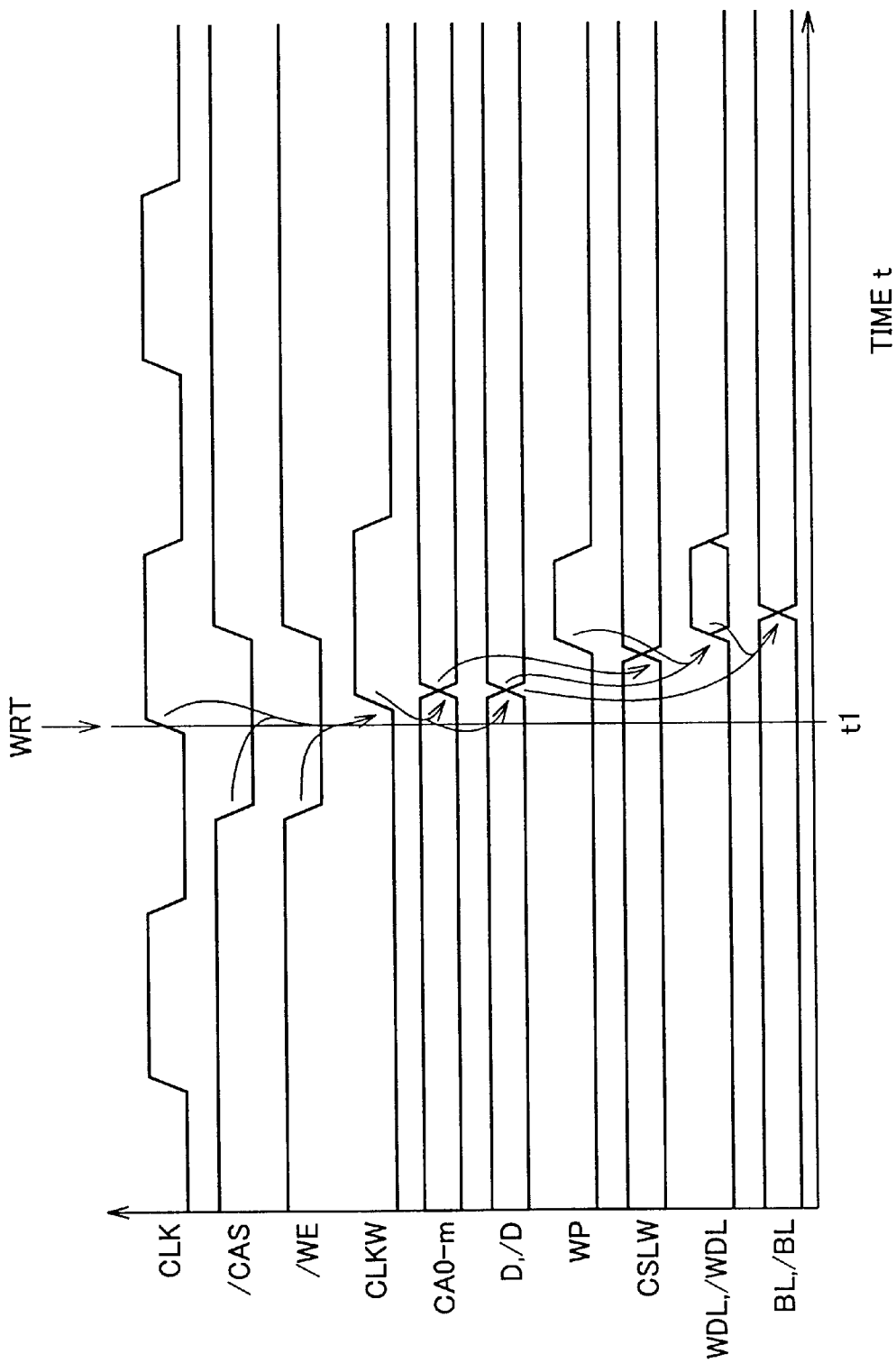
FIG. 11 is a timing chart showing the write operation of DRAM shown in FIG. 10.

FIG. 11 is a timing chart which shows the write operation of DRAM shown in FIG. 10. In FIG. 11, at a certain rising edge of clock signal (time t1), when write command WRT (/CAS=L, /WE=L) is inputted, the level of write clock signal CLKW is kept raised to "H" level for a predetermined time (e.g., for ½ cycle of clock signal CLK) and the level of write pulse signal WP is kept raised to "H" level for a predetermined time (e.g., ¼ cycle of clock signal CLK).

In response to the rising edge of write clock signal CLKW, column address signals CA0 to CAm are fetched and the level of one of a plurality of write column select lines WCSL is raised to selected level of "H" level. In addition, in response to the rising edge of write clock signal CLKW, data signal D is fetched and data signals D and /D are held and outputted.

When the level of write pulse signal WP is raised to "H" level in the form of a pulse, data signals D and /D are transmitted, each in the form of a pulse, to write data lines WDL and /WDL, respectively.

By combining this fourth embodiment with the first, second and third embodiments, even if the level transition of write column select line WCSL and those of write data signals D and /DL occur at different timing due to a skew or the like, data is not written in periods other than the active period of write pulse signal WP and it is thereby possible to prevent erroneous data from being written.

Fifth Embodiment

Figure 12:
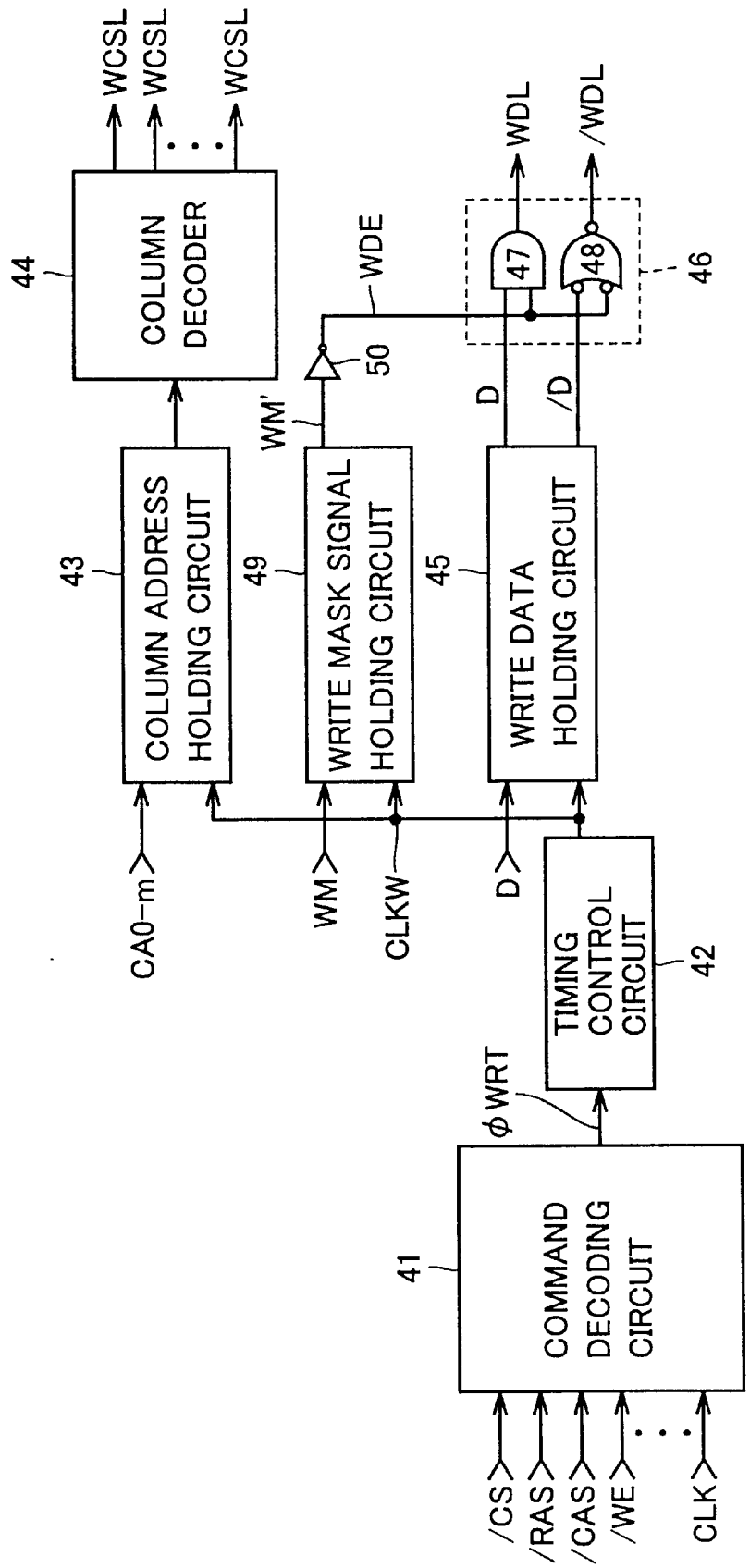
FIG. 12 is a circuit block diagram showing parts related to the write operation of DRAM according to the fifth embodiment of the present invention.

FIG. 12 is a circuit block diagram which shows the sections related to the write operation of DRAM according to the fifth embodiment of the present invention, which diagram is compared with FIG. 10.

In FIG. 12, this DRAM differs from DRAM shown in FIG. 10 in that a write mask signal holding circuit 49 and an inverter 50 are added. Write mask signal holding circuit 49 fetches a write mask signal WM in response to the rising edge of write clock signal CLKW and holds and outputs fetched write mask signal WM'. Output signal WM' of write mask signal holding circuit 49 is inverted by inverter 50 into a write permission signal WDE. Write permission signal WDE is applied in place of write pulse signal WP to write driver 46.

If signal WDE is at inactive level of "L" level, the levels of write data lines WDL and JWDL are both fixed to "L" level. If signal WDE is at active level of "H" level, data signals D and /D are transmitted to write data lines WDL and /WDL through AND gates 47 and 48, respectively.

Figure 13:
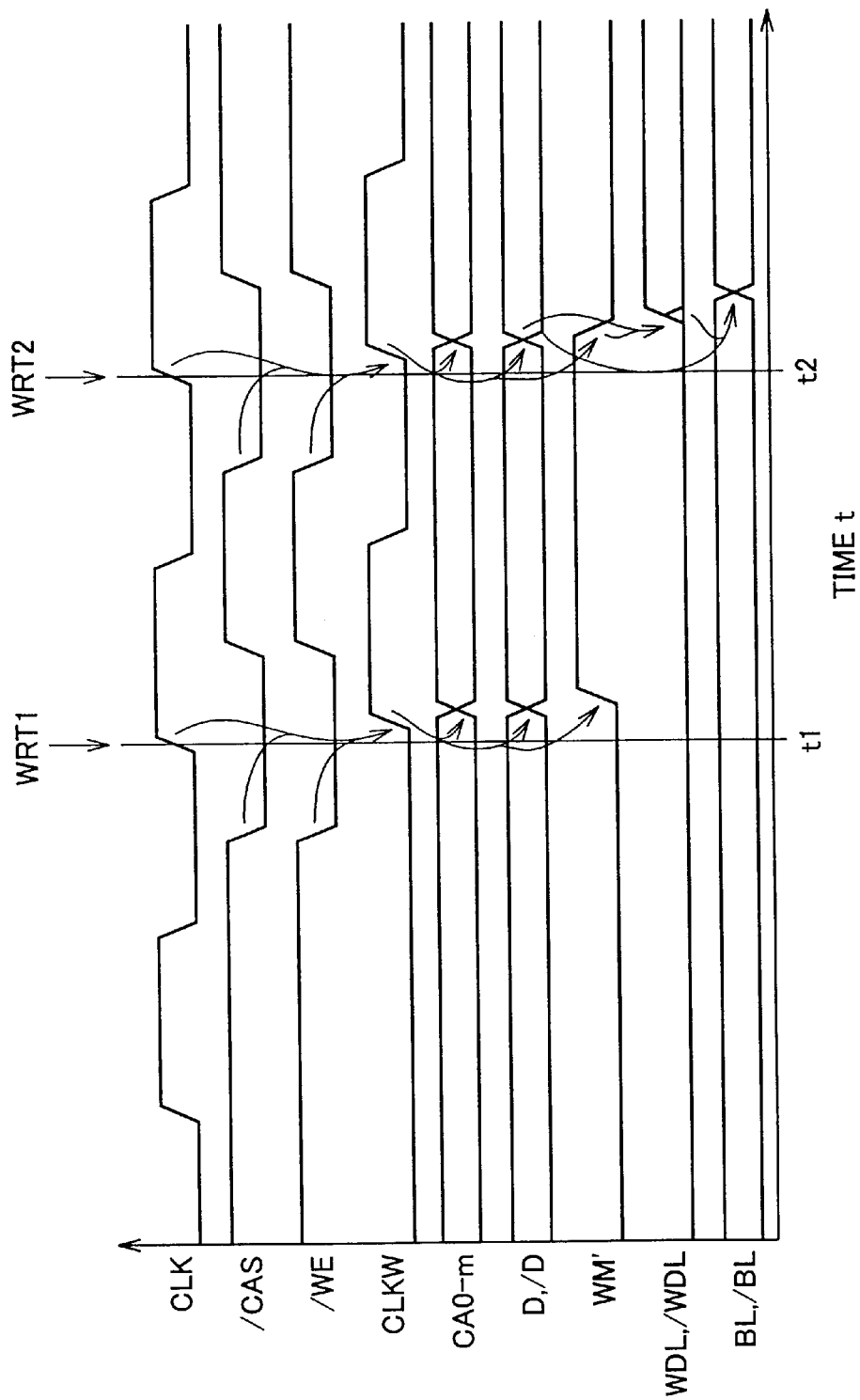
FIG. 13 is a timing chart showing the write operation of DRAM shown in FIG. 12.

FIG. 13 is a timing chart which shows the write operation of DRAM shown in FIG. 12. In FIG. 12, at a certain rising edge of clock signal CLK (time t1), when a write command WRT1 is inputted, the level of write clock signal CLKW is kept raised to "H" level for a predetermined time. At this moment, if it is assumed that the level of write mask signal WM is set at active level of "H" level, then the level of output signal WM' of write mask signal holding circuit 49 is raised to "H" level in response to the rising edge of write clock signal CLKW, write permission signal WDE is set at "L" level, the levels of write data lines WDL and /WDL are both fixed to "L" level, whereby data write is prohibited.

Next, at the other rising edge of clock signal (time t2), when a write command WRT2 is inputted, the level of write clock signal CLKW is kept raised to "H" level for a predetermined time. At this moment, if it is assumed that the level of write mask signal WM is set at inactive level of "L" level, then output signal WM' of write mask signal holding circuit 49 is let fall to "L" level in response to the rising edge of write clock signal CLKW and the level of write permission signal WDE is set at active level of "H" level. As a result, write data signals D and /D are transmitted to write data lines WDL and /WDL through AND gates 47 and 48 and then transmitted to bit lines BL and /BL, respectively, whereby data rewrite is performed.

Figure 14:
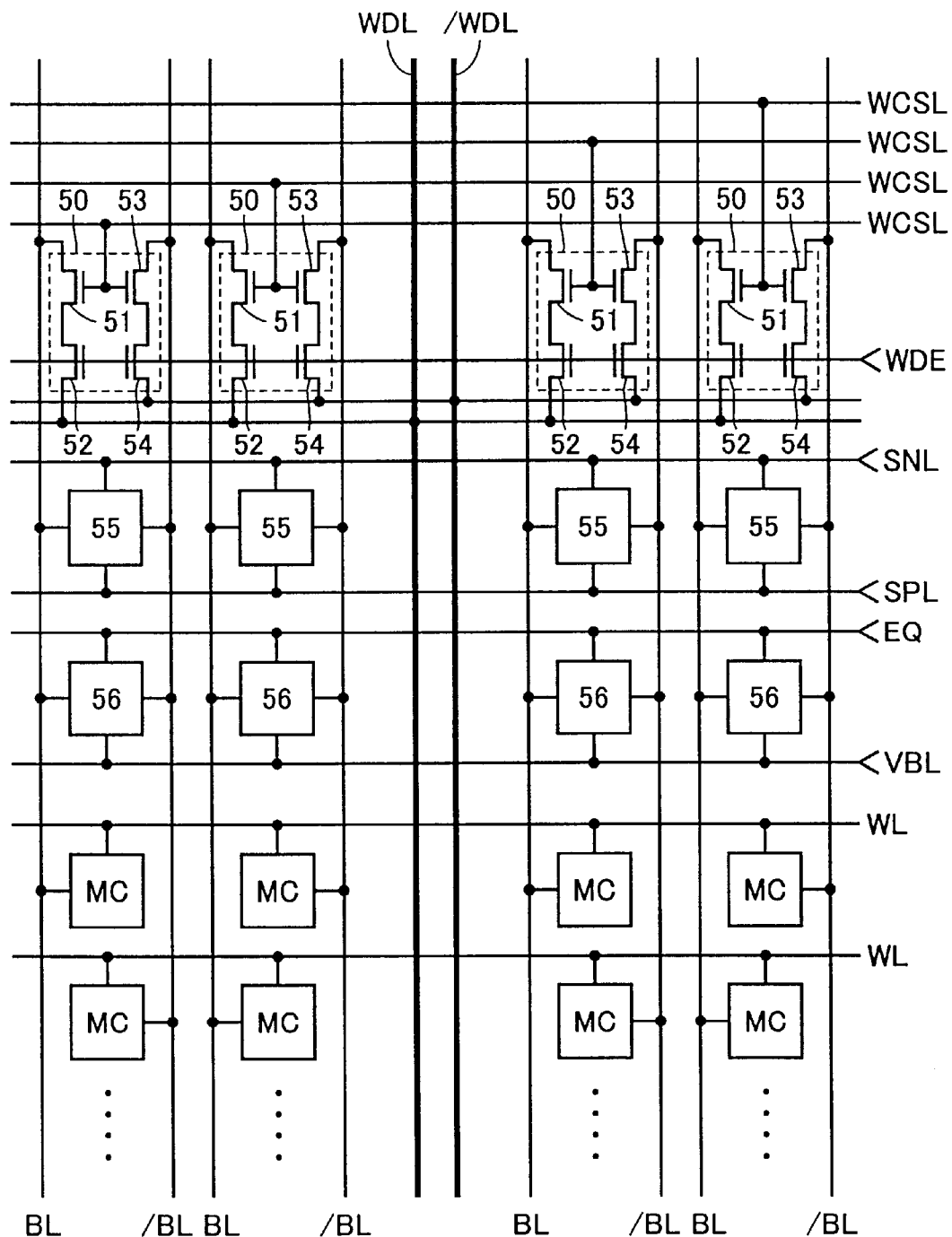
FIG. 14 is a circuit block diagram showing the main parts of conventional DRAM.

By combining this fifth embodiment with the first, second and third embodiments, write driver 46 can control write masking using write permission signal WDE. Therefore, it is unnecessary to extend a signal wiring for signal WDE into memory mat 4 as seen in DRAM shown in FIG. 14 in which each write column select gate 50 controls write masking using write permission signal WDE. Accordingly, it is possible to dispense with the signal wiring for signal WDE, a repeater interposed into the signal wiring halfway and a circuit for hierarchizing the signal wiring, and to thereby reduce the layout area of DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of rewriting a data signal, comprising:

a memory cell array including a plurality of memory cells arranged in a plurality of rows and a plurality of columns, a plurality of word lines provided to correspond to said plurality of rows, respectively, and a plurality of bit line pairs provided to correspond to said plurality of columns, respectively;

a sense amplifier provided to correspond to each of said bit line pairs, and amplifying a potential difference generated between first and second bit lines included in the corresponding bit line pair;

a row decoder selecting one of said plurality of word lines in accordance with a row address signal, and activating the respective memory cells corresponding to said word line;

a column decoder selecting one of said plurality of bit line pairs in accordance with a column address signal;

a write data line pair provided to be common to said plurality of bit line pairs;

a write circuit setting a potential of one of first and second write data lines included in said write data line pair at a first potential and setting the other write data line at a second potential in accordance with a write data signal; and a column select gate connecting the bit line pair selected by said column decoder to said write data line pair, wherein said column select gate includes:
first and second transistors of a first conductive type provided to be common to said plurality of bit line pairs, and having input electrodes connected to said first and second write data lines, respectively; and a switching circuit provided to correspond to each of said bit line pairs, and connecting said first and second transistors between the first bit line and the second bit line included in the corresponding bit line pair and a line of said first potential, respectively, in response to selection of the corresponding bit line pair by said column decoder.

2. The semiconductor memory device according to claim 1, further comprising third and fourth transistors of the first conductive type provided to be common to said plurality of bit line pairs and having input electrodes connected to said first and second write data lines, respectively, wherein said switching circuit connects said first and second transistors between said first bit line and the line of said first potential and between said second bit line and the line of said first potential, respectively, and connects said third and fourth transistors between said first bit line and a line of said second potential and between said second bit line and the line of said second potential, respectively, in response to selection of the corresponding bit line pair by said column decoder.

3. The semiconductor memory device according to claim 1, further comprising third and fourth transistors of a second conductive type provided to be common to said plurality of bit line pairs and having input electrodes connected to said second and first write data lines, respectively, wherein said switching circuit connects said first and second transistors between said first bit line and the line of said first potential and between said second bit line and the line of said first potential, respectively, and connects said third and fourth transistors between said first bit line and a line of said second potential and between said second bit line and the line of said second potential, respectively, in response to selection of the corresponding bit line pair by said column decoder.

4. The semiconductor memory device according to claim 1, wherein said write circuit sets a potential of one of said first and second write data lines at said first potential and the potential of the other write data line at said second potential during a data write period, and holds the potentials of said first and second write data lines to be said first potential in periods other than said data write period.

5. The semiconductor memory device according to claim 1, wherein said write circuit holds potentials of said first and second write data to be said first potential in response to application of a write mask signal for prohibiting the data signal from being rewritten.

6. A semiconductor memory device capable of rewriting a data signal, comprising:

a memory cell array including a plurality of memory cells arranged in a plurality of rows and a plurality of columns, a plurality of word lines provided to correspond to said plurality of rows, respectively, and a plurality of bit line pairs provided to correspond to said plurality of columns, respectively and divided into groups each consisting of N bit line pairs in advance, where N is an integer not smaller than 2;

a sense amplifier provided to correspond to each of said bit line pairs, and amplifying a potential difference generated between first and second bit lines included in the corresponding bit line pair;

a row decoder selecting one of said plurality of word lines in accordance with a row address signal, and activating the respective memory cells corresponding to said word line;

a column decoder selecting one of a plurality of bit line pair groups in accordance with a column address signal;

N write data line pairs provided to be common to said plurality of bit line pair groups, and provided to correspond to the N bit line pairs belonging to each bit line pair group, respectively;

a write circuit provided to correspond to each of said write data line pairs, setting a potential of one of first and second write data lines included in said write data line pair at a first potential and the potential of the other write data line at a second potential in accordance with a write data signal; and a column select gate connecting the N bit line pairs belonging to the bit line pair group selected by said column decoder to said N write data line pairs, wherein said column select gate includes:

first and second transistors of a first conductive type provided to correspond to each of said bit line pairs, and having first electrodes connected to the first and second bit lines included in the corresponding bit line pair, respectively, and having input electrodes connected to the corresponding first and second write data lines, respectively; and a switching circuit provided to correspond to each of said bit line pair groups, and connecting a second electrode of each of the corresponding first and second transistors to a line of said first potential, in response to selection of the corresponding bit line pair group by said column decoder.

* * * * *